United States Patent [19]

Korsunsky et al.

[11] Patent Number: 4,769,905
[45] Date of Patent: Sep. 13, 1988

[54] APPARATUS AND METHOD FOR LOADING SEMICONDUCTOR CHIP CARRIERS INTO SOCKETS

[75] Inventors: Iosif Korsunsky, Harrisburg; Richard C. Schroepfer, Thompsontown, both of Pa.

[73] Assignee: AMP Incorporated, Harrisburg, Pa.

[21] Appl. No.: 50,995

[22] Filed: May 15, 1987

[51] Int. Cl.$^4$ .......................... H05K 1/18; B23P 19/00
[52] U.S. Cl. ........................... 29/842; 29/741; 29/845
[58] Field of Search .................. 29/741, 845, 842; 174/52 FP; 227/121, 132

[56] References Cited

U.S. PATENT DOCUMENTS

| | | |
|---|---|---|
| 3,538,580 | 11/1970 | Bruner . |
| 3,785,035 | 1/1974 | Busler et al. . |
| 3,800,416 | 4/1974 | Shultz, Jr. et al. . |
| 3,875,636 | 4/1975 | Shultz, Jr. et al. . |
| 3,896,533 | 7/1975 | Ullman et al. . |
| 3,948,426 | 4/1976 | La Pointe ........................ 227/132 X |
| 3,990,863 | 11/1976 | Palmer . |
| 4,077,557 | 3/1978 | Green ................................ 29/741 X |
| 4,099,325 | 7/1978 | Baker ................................... 29/741 |
| 4,465,898 | 8/1984 | Orcutt et al. ................... 174/52 FP |
| 4,495,376 | 1/1985 | Hightower et al. ............ 174/52 FP |
| 4,555,847 | 12/1985 | Dornes et al. ....................... 29/739 |
| 4,597,174 | 7/1986 | Sevigny .............................. 29/741 |
| 4,630,875 | 12/1986 | Korsunsky et al. . |

OTHER PUBLICATIONS

"Buyer's Guide, 4th Edition" published by AMP Incorporated in 1973, pp. 209-210.

Primary Examiner—Howard N. Goldberg
Assistant Examiner—Carl J. Arbes
Attorney, Agent, or Firm—Bruce J. Wolstoncroft

[57] ABSTRACT

A hand tool (10) for loading semiconductor chip carriers (30) from a supply magazine (32) into respective sockets (200) for connection to electronic circuitry is disclosed. The hand tool (10) has a loading channel (114) at the front of the load head (110) through which each chip carrier (30) passes as they are loaded into the socket (200). In order to facilitate the loading of each chip carrier (30), admitting slots (162) are provided in the walls of the loading channel (114). The admitting slots (114) are dimensioned to correspond to spaces provided between individual terminals (34) of the chip carrier (30), so that as each chip carrier (30) is loaded from the supply magazine (32) into the socket (200), the admitting slots (162) cooperate with the terminals (34) of the chip carrier (30) to insure that the chip carrier (30) will be precisely positioned in the socket (200). This permits an operator to accurately and rapidly load the chip carrier (30) directly from the supply magazine (32) into the socket (200).

24 Claims, 9 Drawing Sheets

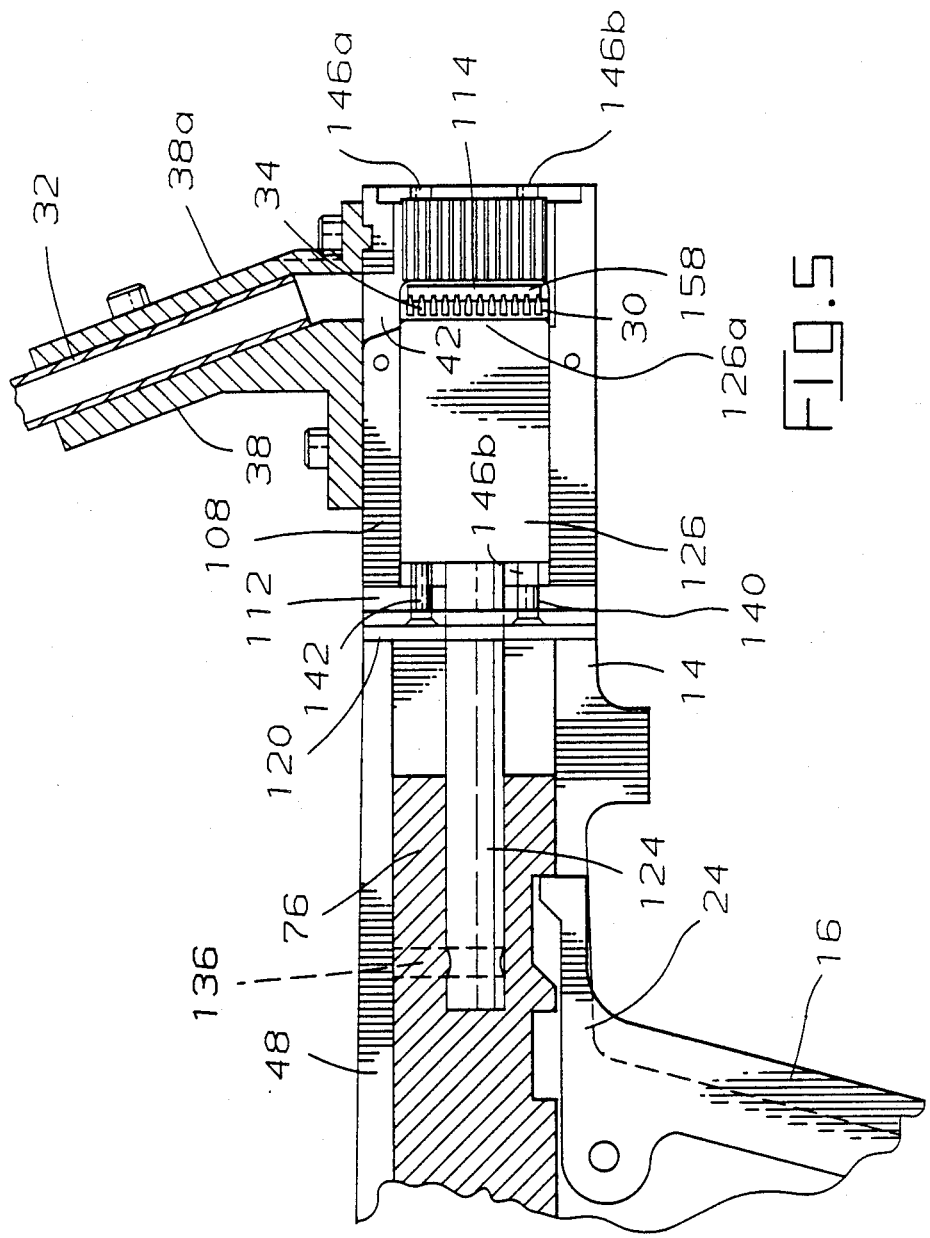

APPARATUS AND METHOD FOR LOADING SEMICONDUCTOR CHIP CARRIERS INTO SOCKETS

BACKGROUND OF THE INVENTION

This invention relates to a hand tool for loading semiconductor chip carriers into sockets for connection to electronic circuitry. One well known type of housing or carrier for a semiconductor chip of the type commonly employed in electronic circuitry is comprised of a rectangularly shaped body of insulating material that encloses the semiconductor chip. A plurality of leads, terminals, or contacts that are connected to the chip and its circuitry extend outwardly from the sides of the carrier body and then extend downwardly and bend around the bottom edge of the rectangular body. The leads terminate on or adjacent the bottom surface of the body. It is common practice to subject the semiconductor chips that are packaged or housed in the rectangular carriers to a test or "burn in" to be sure that they meet certain standards prior to inserting them into a circuit board of an electronic device or component. Unless there is an extremely high volume of chip carriers involved, the use of automatic insertion apparatus for inserting the carriers into burn-in sockets cannot be justified. When the automatic insertion apparatus is not employed, the chip carriers are inserted into their burn-in sockets by hand. Many of the chip carriers are small compared to human finger tips and their handling by a human operator is troublesome and time consuming. Furthermore, because of their small size and the small size of the burn-in socket, it is difficult for the operator to always get the carrier properly aligned into the socket. The carrier may get cocked and wedged in the socket and its leads will not make proper contact with the leads in the socket. Because of the small sizes of the carriers, it often is difficult to retrieve the misaligned carrier from the socket and reinsert it properly into the socket. These difficulties are time consuming, lead to frustration of the operator, and increase the possibility that the chip in the carrier will not be subjected to a proper burn-in procedure.

SUMMARY OF THE INVENTION

The tool of this invention is a hand tool that permits an operator to accurately and rapidly load semiconductor chip carriers directly from a supply magazine into a socket. Although the tool of this invention is particularly useful in loading burn-in sockets, its use is not limited to this type of socket. The tool is comprised of a pistol grip type of housing having a loading channel at the front, or nose, of a load head. A tubular magazine of chip carriers is mounted in registration with an admitting slot in the wall of the load head. A plunger is reciprocated back and forth in the channel in the load head by means of an actuator and slide bars in the body of the housing. Spring means couples the plunger to the slide bars and actuator. A carrier passes through the admitting slot and assumes a precise and predetermined position in the channel in front of the plunger. The front of the channel is constructed and arranged to assure that the carrier maintains its precise, predetermined position as it is pushed out the exit end of the channel by the advancing plunger.

The exit end of the load head is constructed and arranged to closely fit the contour of a socket into which carriers are to be loaded, and the plunger may be cocked to a position so that its forward end extends beyond the front end of the tool. These features allow an operator to insert the extended plunger into an empty socket and arrange and align the tool relative to the socket so when the plunger is retracted and a carrier is loaded into the channel, a carrier having a predetermined orientation is accurately aligned and properly presented to the socket. The spring coupling of the plunger to the actuator assures that the force with which the carrier is loaded into the socket does not exceed a predetermined magnitude.

BRIEF DESCRIPTION OF THE DRAWINGS

FIGS. 5 and 6 are simplified partial views showing the plunger in relation to the interior of one side of the load head of FIG. 4 during different stages of loading a chip carrier;

DESCRIPTION OF THE PREFERRED EMBODIMENT

The tool of this invention is particularly useful for inserting semiconductor chip carriers of the type described above into burn-in sockets of the type described in U.S. Pat. No. 4,630,875 issued Dec. 23, 1986 to I. Korsunsky et al., the disclosure of which is incorporated herein by reference. In the following description, it will be assumed that the carriers and socket are of the general type described in that patent. It should be understood, however, that the use of the tool of this invention is not restricted to that type of socket, nor is its use restricted to the particular type of carrier illustrated and described herein and in the referenced patent. Further, principles of operation embodied in the tool of this invention are applicable to automated loading apparatus as well as to a manually operated tool.

Figure 1:
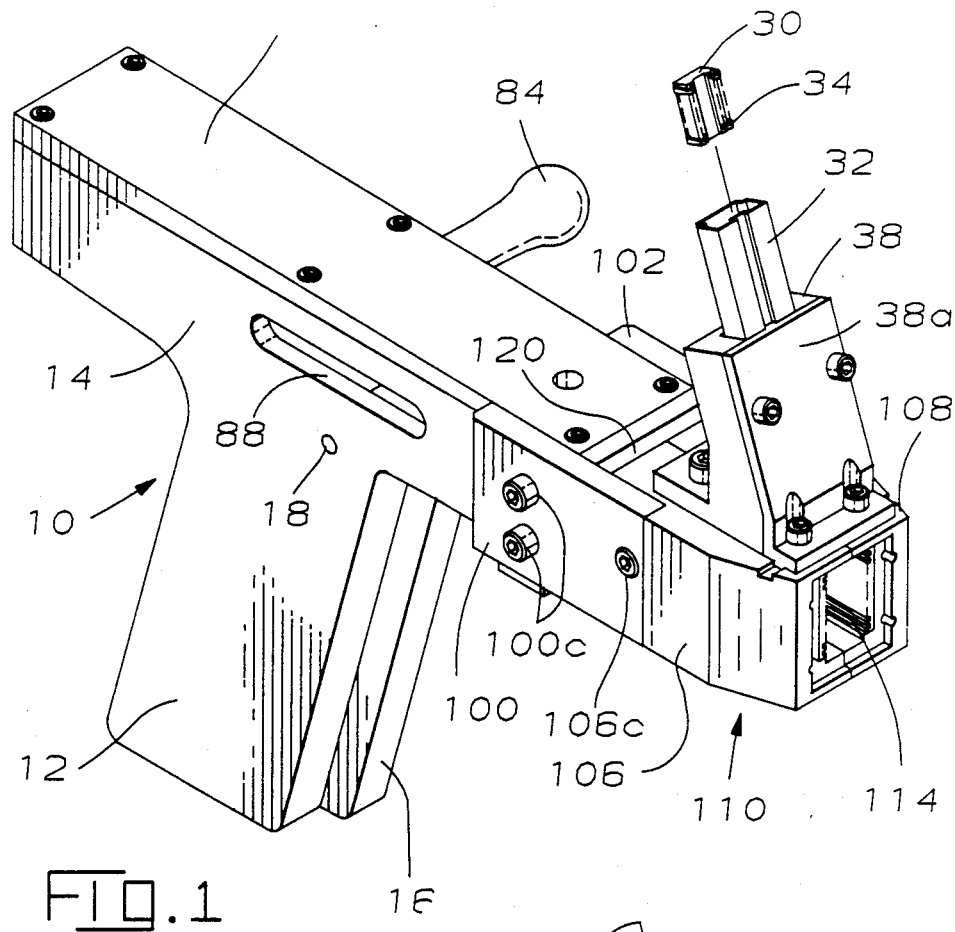
FIG. 1 is a perspective view of the novel semiconductor chip carrier loading tool of this invention.
Figure 2:
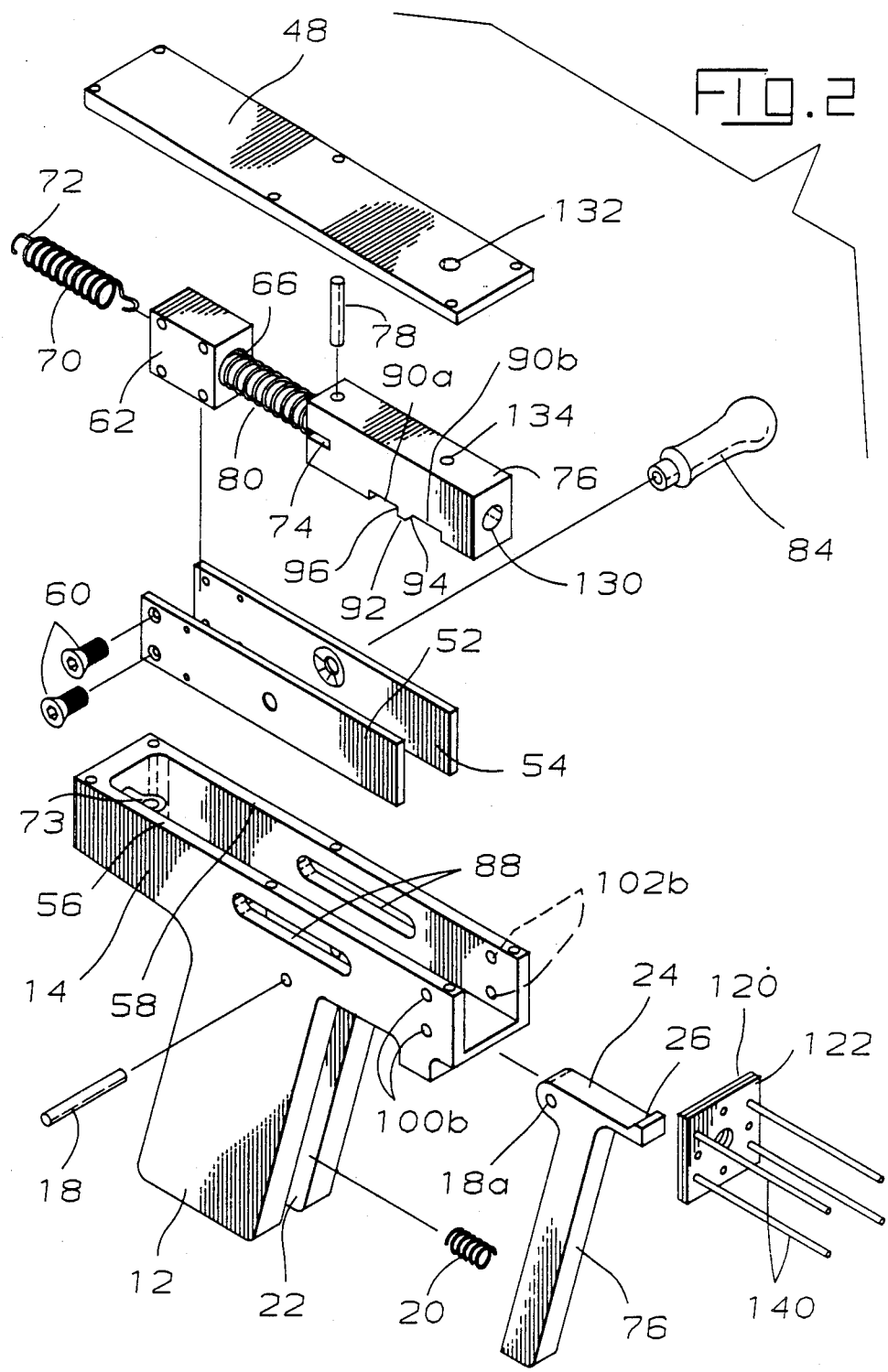
FIG. 2 is a simplified exploded view of the housing and internal parts of the tool of this invention.
Figure 3:
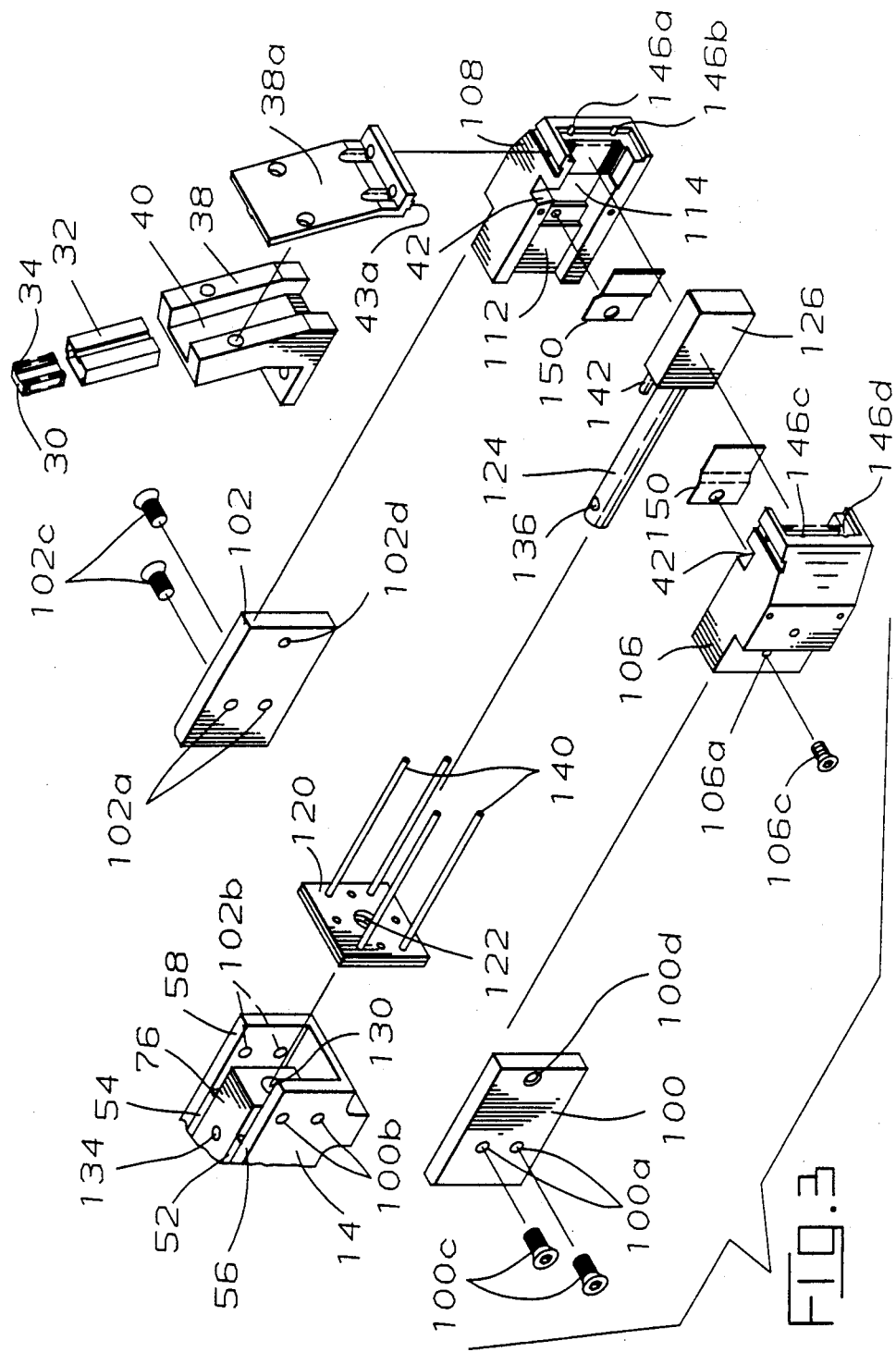
FIG. 3 is a simplified exploded view of the load head portion of the tool which is attached to the front of the housing portion of FIG. 2.

Referring to FIGS. 1-3, the tool 10 of this invention is in the form of a pistol grip type tool having a handle 12 that extends downwardly from a horizontal body portion 14. A release trigger 16 is pivotally mounted in handle 12 by means of pivot pin 18. A helical spring 20 is partially received in an aperture (not shown) in handle 12 and is in contact with the back surface of trigger 16 to urge it outwardly from the slotted recess 22 in handle 12. Trigger 16 has a generally horizontal top arm 24 that includes an upwardly projecting cam 26 on its right end. A pivot pin receiving aperture 18a is in the left end of top arm 24.

As best seen in the simplified illustrations of FIGS. 1 and 3, chip carriers 30 of the well known type described above are shipped from their manufacturer in elongated, hollow tubes or magazines 32. In practice, magazine 32 is a shaped tube that may be 18 to 24 inches in length, for example. As illustrated, all chip carriers or housings 30 are oriented within magazine 32 with their terminals or contact pads 34 facing forwardly toward the nose of tool 10. Magazine 32 is received and supported within a rectangular channel 40 in magazine retainer 38, 38a that is secured to the top surface of tool. As received from the semiconductor chip manufacturer, tubular magazine 32 has end caps or retainer on its two ends to retain carries 30 therein. The end retainers are removed before magazine 32 is inserted within retainer 38. After insertion, the chip carriers 30 are free to slide by gravity to the bottom end of magazine 32 and through an admitting slot 42 in the top wall of tool 10, as will be described in more detail below.

The novel means by which the chip carriers are pushed out of the nose end of the tool 10 and into a carrier-receiving socket now will be explained. Within the horizontal body portion 14 of the tool, and below a cover 48, FIG. 2, a pair of spaced, elongated slide bars 52, 54 are positioned along opposite side walls of the rectangularly shaped cavity between side walls 56 and 58 of body portion 14 of the tool. The left, or rear, ends of slide bars 52 and 54 are secured by countersunk screws 60 to a slide coupler block 62. An axial bore 66 extends completely through coupler block 62 from front to rear. The diameter of bore 66 is greater on its right end than on its left end for a reason that will become apparent.

An inner helical spring 70 is secured by means of hook 72 on its left end to an eye hook 73 (FIG. 2), or other suitable means, at the left or rear end of body portion 14. Spring 70 passes coaxially through bore 66 in coupler block 62 and is secured to a pin 78. in a notch 74 in the left end of a plunger slide 76. Plunger slide 76 is free to move longitudinally relative to slide bars 52 and 54. A second helical spring 80 is larger in diameter than spring 70 and is disposed coaxially about spring 70. Outer spring 80 is seated within the enlarged right, or front, end of bore 66 and approximately half of its length extends out of the bore and toward plunger slide 76.

A slide actuator 84 passes through a slot 88 in the side wall of body portion 14 and is secured to one of the slide bars 52 or 54 by means of a countersunk screw. It is seen that each side wall of body portion 14 has a slot 88 therein to receive actuator 84, and both slide bars have an appropriate countersunk hole therein for securing the actuator thereto. With this arrangement, actuator 84 may be mounted for engagement by the operator's left hand, as illustrated, or by his right hand. Inner helical spring 70 is in tension and pulls plunger slide 76 backwardly toward coupler block 62.

The bottom surface of plunger slide 76 has recesses 90a and 90b machined therein, FIG. 2, to provide a cam member 92 that has a sloping surface 94 on its forward side and a vertical surface 96 on its rear side. Projecting cam 26 on trigger 16 selectively falls within recesses 90a or 90b. In the unactuated condition of the tool, cam 26 is within recess 90 b and hold plunger slide 76 at a given position in front of the free end of spring 80; assuming slide bars 52, 54 are at their rearmost positions.

Figure 7:
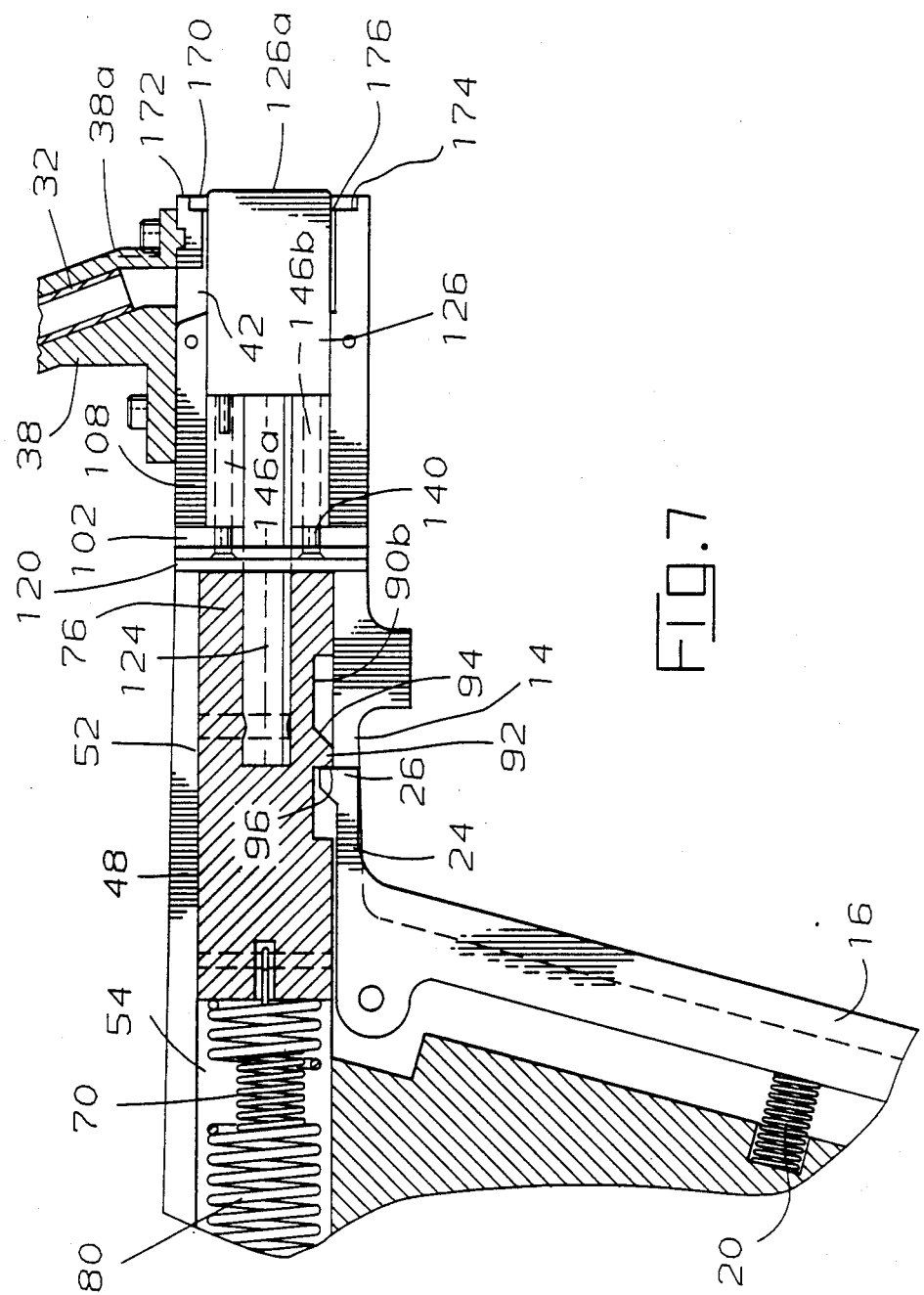
FIG. 7 is a simplified illustration of the front end of the tool of this invention showing the trigger and plunger in cocked positions.

When the operator pushes actuator 84 forwardly to the right in FIG. 2, slide bars 52, 54, coupler block 62 and outer spring 80 likewise move forward. Plunger slide 76 is pushed forwardly by the free end of spring 80. Projecting cam 26 on pivotable trigger 16 initially is in recess 90b in plunger slide 76, and as plunger slide 76 moves forwardly cam 26 will ride up inclined surface 94 of cam 92, will pass over the crown of cam 96, and will fall into recess 90a to the left of cam 92, as illustrated in FIG. 7. If actuator 84 then is released, projecting cam 26 will be engaged with the vertical surface 96 of cam 92 to hold plunger slide 76 in a forward position. It may be said that plunger slide 76 is in a cocked position when the cams 26 and 92 are engaged as just described. After plunger slide 76 is cocked by means of projecting cam 26 on trigger 16, in the absence of a forwardly directed force on actuator 84, slide bars 52 and 53 are free to slide backwardly independently of the position of plunger slide 76.

When plunger slide 76 is in such a cocked position, pulling on trigger 16 in the direction toward handle 12 pivots horizontal arm 24 of the trigger in a clockwise direction and causes projecting cam 26 to ride up and over the vertical back surface 96 of cam 92. This action releases plunger slide 76 so that it is pulled to the rear by the stretched inner spring 70. Projecting cam 26 on trigger 16 then rests within the forward recess 90b in the bottom of plunger slide 76.

Looking now at FIGS. 1–3 to see the construction of the front end of the tool, coupler plates 100, 102 have respective pairs of apertures 100a, 102a, FIG. 3, that register with respective pairs of threaded apertures 100b, 102b on side walls 56 and 58 of horizontal body portion 14. Pairs of screws 100c and 102c pass through apertures 100a, 102a, and are threaded into apertures 100b, 102b to fasten plates 100 and 102 to body portion 14 of the tool. Apertures 100d, 102d on the right ends of the coupler plates are in alignment with threaded apertures 106a and 108a (not shown) in the back portions of a pair of load blocks 106 and 108 and are secured thereto by means of screws 106c and 108c (not shown).

Load blocks 106, 108 are mirror images of each other and fit together along their inner surfaces to form one load or nose head 110. Transversely extending pins, not illustrated, may be used to releasably hold the two load block halves together. Load blocks 106, 108 have a portion of their respective central regions machined so that when they are joined together as illustrated in FIG. 1 they have an inner channel 112 that extends completely through the load head 110. Channel 112 is in alignment with the rectangular channel between side walls 56, 58 in body portion 14 of the tool. It is seen in FIG. 3 that one half of slot 42 that extends through the top wall of the load head 110 is in each of the load blocks 106, 108. The two-piece magazine retainer 38, 38a is attached to the top surfaces of load blocks 106, 108 and the channel 40 of the retainer is in vertical alignment with admitting slot 42. A key 43a on retainer piece 38a fits into keyway 3b on the top surfaces of blocks 106, 108. With this arrangement, semiconductor chip carriers 30 from the magazine 32 may fall through slot 42 and into the loading channel 114 of load head 110.

The means for accurately seating tool 10 on a socket and for pushing a chip carrier out of the tool and into the socket will be described by referring to FIGS. 2-4, and 7. On the left side of the partial, exploded view of FIG. 3, slide bars 52, 54 and plunger slide 76 are shown within side walls 54, 56 of body portion 14 in their unactuated positions. A pin retaining and striker plate 120 is positioned adjacent the front end of body portion 14 and is dimensioned to butt against the end thereof. Striker plate 120 has an aperture 122 extending through its center region. Aperture 122 has a diameter sufficient to freely accept the cylindrical stem 124 of a plunger member 126. Stem 124 of a plunger 126 passes through striker plate 120 and is received in a central bore 130 in plunger slide 76. Stem 124 is secured within bore 130 by means of a threaded retaining pin or screw that is received in threaded aperture 134 in plunger slide 76 and aperture 136 in stem 124. Consequently, plunger 126 is fixed to and moves with plunger slide, 76.

Pin retaining and striker plate 120 actually is comprised of two plates that are secured together. The front one of the plates has four spaced holes extending therethrough to permit the passage of four parallel push pins 140. The pins have enlarged heads that are received in countersunk holes on the back side of that front plate. The back one of the two plates that make up striker plate 120 is secured to the front plate by a plurality of screws, for example, so that striker plate 120 functionally acts as a single plate. FIG. 5 illustrates plunger 126 in its unactuated, or "at rest", position and shows that when so positioned the back surface of striker plate 120 is held against the right end of body portion 14 by a small horizontal pin 142 that is on the left, or back, surface of plunger 126. In its unactuated position, plunger 126 is urged to the left because plunger slide 76 to which it is attached is pulled to the left by inner spring 70.

Figure 1A:
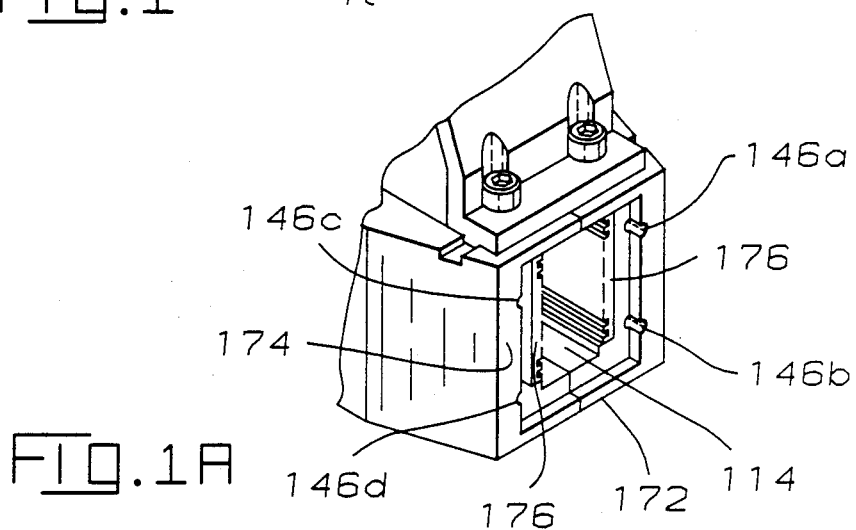
FIG. 1a is a fragmentary perspective view of the load head of the tool.

The four push pins 140 that extend forwardly from striker plate 120 are freely received in mating parallel bores 146a-d in load head 110. As seen in FIGS. 1, 1a, and 3, parallel bores 146a and 146b exit exit at the front and right side of load block 108, and parallel bores 146c and 146d exit at the front and left side of load block 106. In their unactuated positions, the right ends of push pins 140 are within the bodies of load blocks 106 and 108 and do not protrude from the exit ends of the bores 146a-d.

Figure 4:
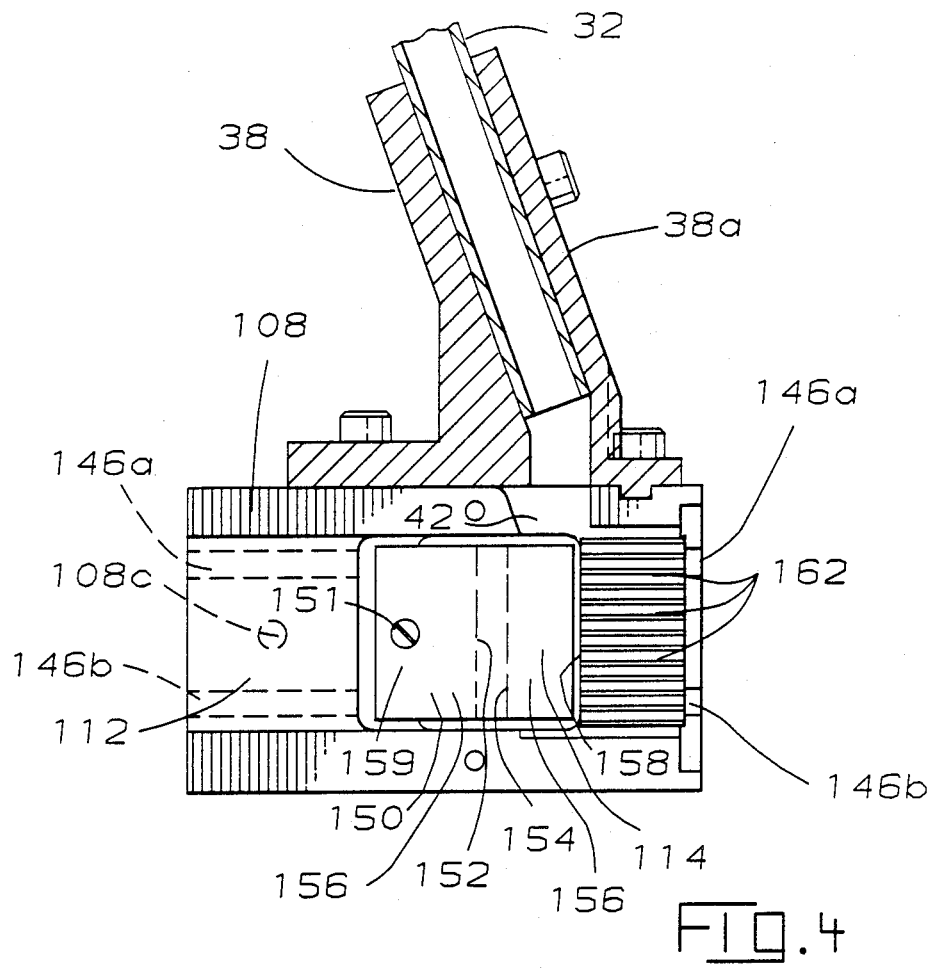
FIG. 4 is a simplified partial view showing only the internal construction of one side of the load head.

The construction and arrangement of inner channel 112 and load channel 114 within load blocks 106 and 108 can be seen by reference to FIGS. 3 and 4. FIG. 4 is a view only of the interior of load block 108. Within the middle portion of channel 112 a recess is machined to receive a thin, rectangularly shaped spring member 150 that is secured to the inside wall by means of screw 151. The rear portion of spring 150 is flat and substantially in a vertical plane that is parallel to the side wall of the left end of channel 112. The spring bends slightly inwardly into the channel at a vertically extending region 152 and then bends in the opposite direction along the vertical region 154 so that the portion 156 on the right end portion 156 of the spring is substantially parallel to the central axis of channel 112. In practice, the right end portion 156 of spring 150 is offset from the left end portion by approximately 0.020 inch. When load heads 106 and 108 are assembled together in their operative relationships as illustrated in FIG. 1, the spacing between the rear portions 159 of the two springs 150 on the respective load heads is just slightly greater than the width of a chip carrier. With this arrangement, a chip carrier may freely fall by gravity from magazine 32, through slot 42 and into the load channel 114 between springs 150.

The extreme right or front ends of springs 150 each terminate in a raised ridge 158 that extends inwardly into the channel just sufficiently so that the contacts of a chip carrier that is between the ridges 158 are slightly and resiliently engaged by the ridges of the springs, as will be explained in more detail below.

The right end region of each of the inner walls of load blocks 106, 108 includes a plurality of evenly spaced, parallel, horizontally extending projections 162 that extend inwardly into the load channel 114. The spacing between adjacent projections 162 on a load block is sufficient to permit the terminal, or leads, or contact pads on the sides of chip carriers to pass through the void spaces between the projections. The projections serve as guides for the terminals to keep a carrier in a desired, predetermined orientation as a carrier is pushed through the load channel 114. If it were not for the void spaces between projections 162, the projections would interfere with the passage of the terminals of a chip carrier through the load channel 114.

The particularly advantageous construction and arrangement of the load blocks 106, 108 and the load channel 114 thus become apparent. It is seen in FIG. 5 that when a chip carrier 30 falls through slot 42 and into the bottom surface of load channel 114, its back surface is closely adjacent and parallel to the vertical surface 126a on the front end of plunger 126. The height and width of the front end surface of plunger 126 are substantially the same dimensions as the back surface of carrier 30, and because the two surfaces are so close as to be substantially contacting each other, when a carrier falls into the load channel there is virtually no chance for the carrier to become tilted backwardly. The separation between the rear regions 159 of spring members 150 where chip 30 falls into channel 114 is proportioned to be just slightly greater than the width of a carrier so that the carrier it may freely fall into the load channel but cannot tip sideways.

To push a carrier 30 out the front or exit end of load channel 114, the operator advances actuator 84 forwardly. This motion advances slide bars 52, 54 and coupler block 62 forwardly within horizontal body portion 14. Coupler block 62 freely slides relative to inner spring 70. When the free end of outer spring 80 engages the rear end of plunger slide 76, spring 80 compresses until the friction acting against plunger slide 76 is overcome. Plunger slide 76 then is moved forwardly by the advancing outer spring 80 and against the restraining force of inner spring 70. Because plunger 126 is fixed to plunger slide 76 by way of the plunger stem 124, the front face 126a of plunger 126 engages the back surface of carrier 30 and advances the carrier forwardly. As the carrier moves slightly forward, the terminals or contact pads 34 frictionally engage the inwardly protruding front edges 158 on the opposite spring members 150. Because these protruding edges are on the free, unsupported edges of the springs, they are free to resiliently deflect outwardly and will act only as a "drag" on the advancing carrier and will not offer any significant impediment to movement of the carrier. This engagement tends to slightly retard the carrier, but in doing so, forces the back surface of the carrier firmly against the front vertical surface 126a of plunger 126.

Figure 6:
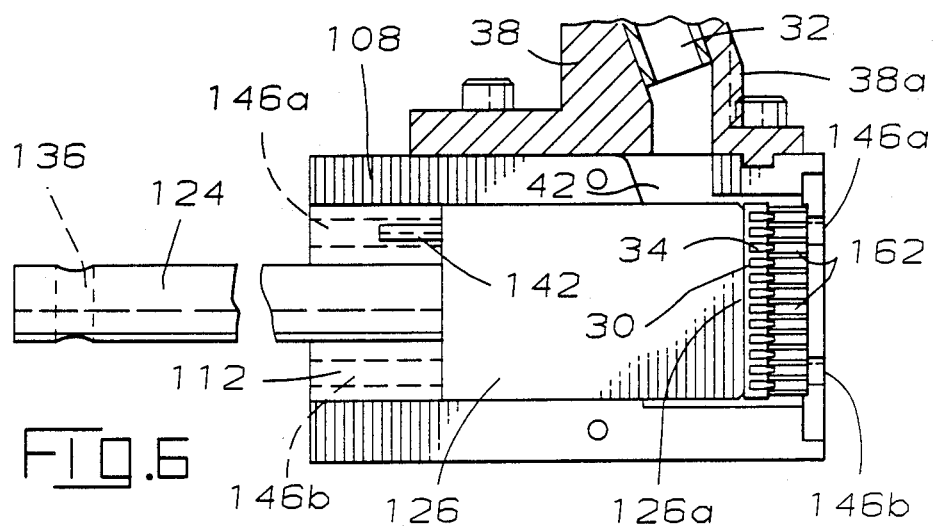

The carrier now is very precisely aligned within the load channel between front surface 126a on plunger 126 and the two inwardly protruding edges 158 of springs 150. In this aligned position, the terminals or contact pads 34 on the two sides of the carrier are in registration with the void spaces between the inwardly protruding, parallel, horizontally extending ridges 162. As the carrier continues to advance toward the right, FIG. 6, the contacts 34 move through the void space between ridges 162 in sliding engagement with the top and/or bottom surfaces of ridges 162. With the carriers thus very accurately positioned as they move through load channel 114, they are unfailingly presented to the open front end of the channel at precisely the same orientation and position.

Because the position and orientation of a carrier is accurately maintained from the time it falls into the load channel until the time it reaches the exit end, the possibility that a carrier will become misaligned and wedged or jammed within the channel are substantially eliminated. This greatly contributes to the usefulness of the tool because it permits a greater production rate from the operator, and because the carriers do not become jammed within the tool, the operator need not be highly skilled.

Further advantageous features of the tool of this invention which permit the operator to accurately and rapidly align the tool relative to a carrier-receiving socket now will be discussed. When the tool is in its cocked condition illustrated in FIG. 7, the flat forward end 126a of plunger 126 extends outwardly beyond the right end 170 of the tool. As clearly seen in FIG. 1a, the right end of the load head 110 terminates in the narrow, frame-like, rectangular extension 172 which extends beyond the end face 174. On end face 174 and adjacent each of the long dimensions of load channel 114 are respective slightly raised or offset pads 176. As illustrated, the heights of offset pads 176 are considerably less than the height of frame-like extension 172. As an example, the height of offset pads 176 may be approximately 0.015 inch and the height of extension 172 may be approximately 0.93 inch. It also is seen in FIG. 1a that the bores 146a–d in which pins 140 are received exit partially in end face 174 and partially in extension 172.

Figure 8:
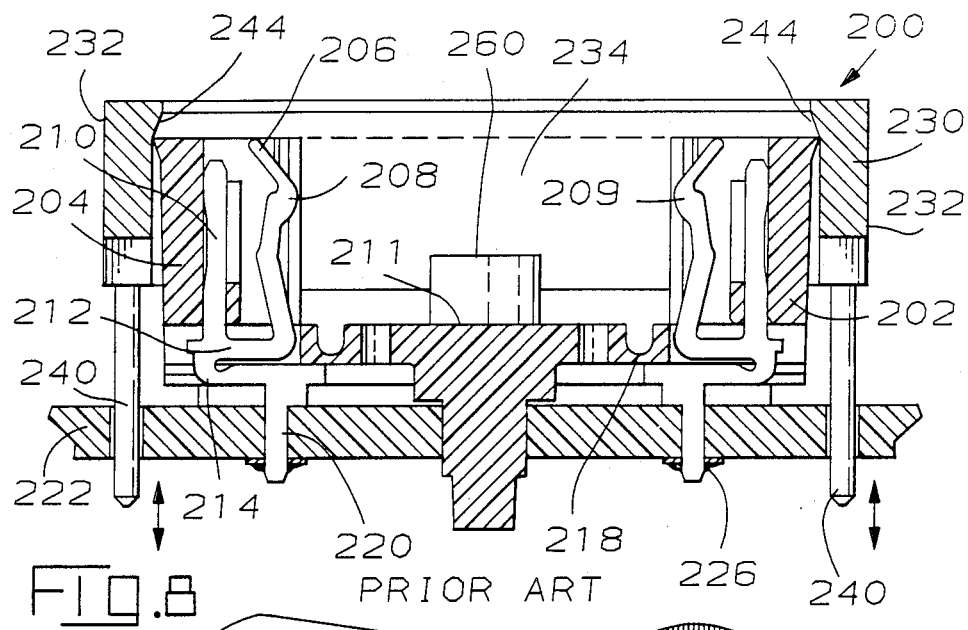
FIG. 8 is a simplified illustration of a burn-in socket of the general type that may be loaded by the tool of the invention.

As previously mentioned, tool 10 is particularly suitable for use with the type of burn-in socket described in U.S. Pat. No. 4,630,875, to which reference is hereby made. A socket 200 of that general type is illustrated in FIG. 8 and, briefly described, is comprised of parallel side walls 202, 204 of electrical insulating material such as a suitable plastic. Side walls 202, 204 each include a plurality of terminal receiving slots that extend transversely to the side walls. A terminal 206 is in each slot and includes arms 208, 210 that extend upwardly from a yoke portion 212. A neck 214 leads to a post 220 that is received in an aperture in a circuit board 222 of known type of construction. Post 220 may be electrically connected to a conductor strip on board 222 by means including a solder joint 226. The terminals 34 on a chip carrier engage the terminals 208 of the socket at the regions 209. Side walls 202, 204 of the plastic frame have limited pivotable motion about the integral and elastic pivot joints 218 that join the respective side walls to the base 211 of the socket.

An open rectangularly shaped, rigid, metal frame 230 surrounds the socket and is comprised of opposite side rails 232 and opposite end rails 234. Secured at each bottom corner of metal frame 230 is a pin 240 which freely passes through printed circuit toard 222. The opposite ends of the pins 240 are coupled to actuation means (not illustrated) that cause the pins and frame to move upwardly to a first position from a second, or locking position. In FIG. 8, frame 230 is shown in its first position.

Figure 11:
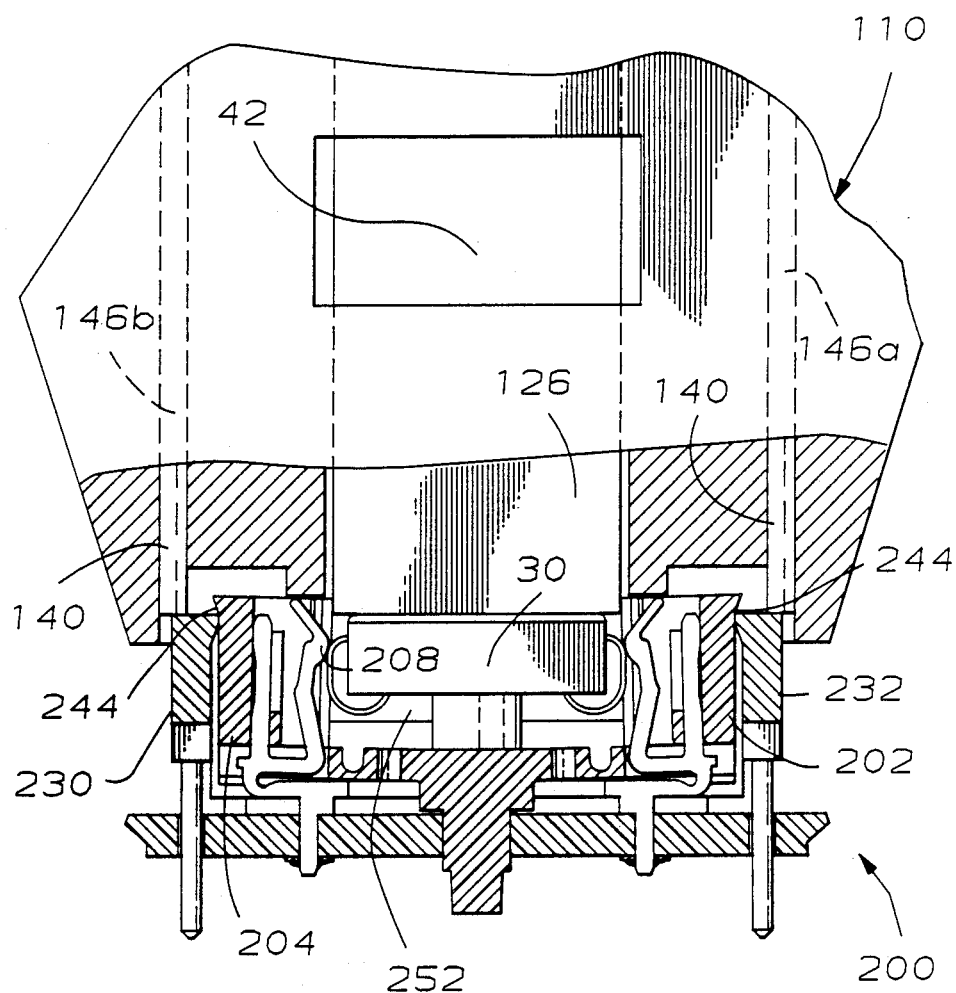
FIG. 11 is a simplified illustration showing the fully extended plunger of the tool of this invention loading a carrier into a socket of the type illustrated in FIG. 8.

Side rails 232 of frame 230 have inwardly sloping camming surfaces 244 at their tops. The camming surfaces are above the top surfaces of side walls 202, 204 of the socket when frame 230 is in its upper, or first, position that is illustrated in FIG. 8. When frame 230 is moved downwardly to its second, or lower, position which is illustrated in FIG. 11, camming surfaces 244 on side rails 232 engage the outer surfaces of side walls 202, 204 of the frame and pivot them inwardly so that terminals 208 of the socket firmly engage the terminals 34 of a carrier to hold the carrier securely within the socket. This provides the so-called zero insertion force, or low insertion force, feature of the socket. When the side rails 232 of frame 230 return to their upper positions, the camming surfaces 244 disengage from side walls 202, 204 and those walls return to their original positions.

Returning now to the advantageous features of tool 10 that assure its proper positioning and alignment with socket 200 in preparation for loading a chip carrier into the socket, reference is made to FIGS. 1, and 7–11. After a carrier 30 has been inserted into a socket and prior to the next carrier falling through slot 42 and into loading channel 114, the operator grasps actuator handle 84 and moves slide bars 52, 54 and plunger slide 76 to their forward positions, FIG. 7, and makes sure that trigger 16 is urged in the counterclockwise direction by spring 20. Actuator 84 is urged forwardly until protruding cam 26 on the end of trigger 16 is engaged behind vertical wall 96 of cam member 92 in the bottom surface of plunger slide 76. With this relationship, the end of plunger 126 is beyond the front end 170 of nose block 110, plunger slide 76 is substantially flush with the forward end of horizontal body portion 14, and slide bars 52, 54 are to the rear of the forward end of body portion 14. Because plunger slide 76 and slide bars 52, 54 do not extend beyond the forward end of body portion 14, there is no force applied to striker plate 120 and it rides freely on shaft 124 in the space between the end of body portion 14 and the left ends of load blocks 106, 108. The left or rear ends of load blocks 106, 108 and the end of horizontal body portion 14 are separated by approximately 0.250 inch.

The lengths of pins 140 that are secured to striker plate 120 are selected so that they do not protrude beyond the end face 174 at the nose of the tool until striker plate 120 is within approximately 0.125 inch of the left ends of load blocks 106, 108. Consequently, with plunger slide 76 in its cocked position illustrated in FIG. 7, either pins 140 remain entirely within their respective bores 146a–d or they are forced back into those bores if the ends of the pins encounter any force applied axially to the left.

Figure 9:
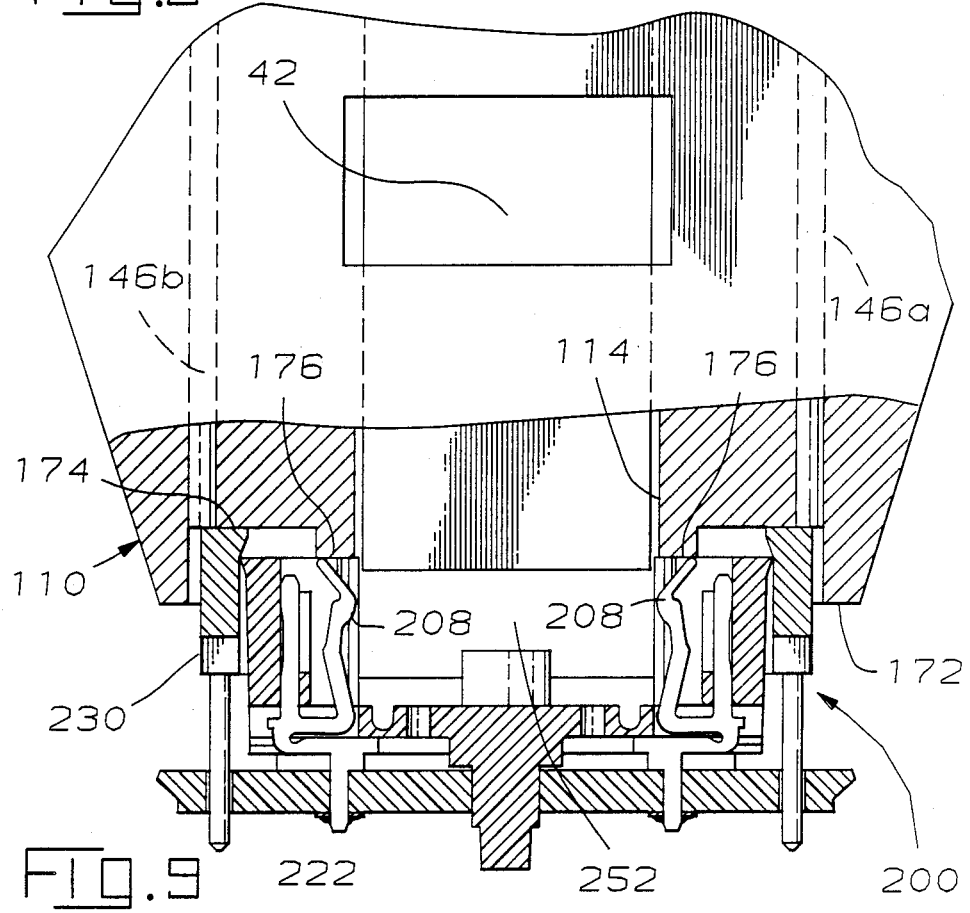
FIG. 9 is a simplified illustration showing the cocked plunger extending out the exit end of the load channel and inserted into an empty socket to align the tool and channel relative to the socket.

With the tool in the condition just described, the protruding forward end of plunger 126 is inserted into the void space between terminals 208 in socket 200, as illustrated in FIG. 9. The rectangular extension 172 on the nose end of nose block 110 fits about metal frame 230, and the forwardly extending pads 172 adjacent the exit end of load channel 114 of the tool, FIGS. 1a and 7, are in butting contact with the outer or top ends of the transverse plastic members that form the terminal receiving slots in side walls 202, 204 of the socket.

It can be seen that because plunger 126 is received within void space 252 of the socket, the load channel 114 of tool 10 is very accurately positioned relative to the void space in the socket that is to receive a carrier from the tool. Furthermore, the nose of the tool is held relatively fixed on the socket by means of the extension 172 on the nose of the tool being in closely surrounding relationship to the metal frame 230 of the socket. And, the pads 176 on the front face of the tool are in butting contact with the tops of the plastic terminal partitions in the socket to further accurately position the nose of the tool on the socket.

Keeping the nose of the tool in mating contact with the socket, the operator next pulls trigger 16 of the tool to cause protruding cam 26 on the trigger to become disengaged from vertical surface 96 on cam 92 on the bottom of plunger slide 76. This allows inner spring 70 to pull slide plunger 76 to its rearmost position. These positions of the slide bars and plunger slide are substantially as illustrated in FIG. 3. When so positioned, protruding cam 26 on the right end of trigger 16 is within slot 90b on the bottom of plunger slide 76. The rearward movement of plunger slide 76 also moves plunger 126 to the rear, substantially to the position illustrated in FIG. 5.

Figure 10:
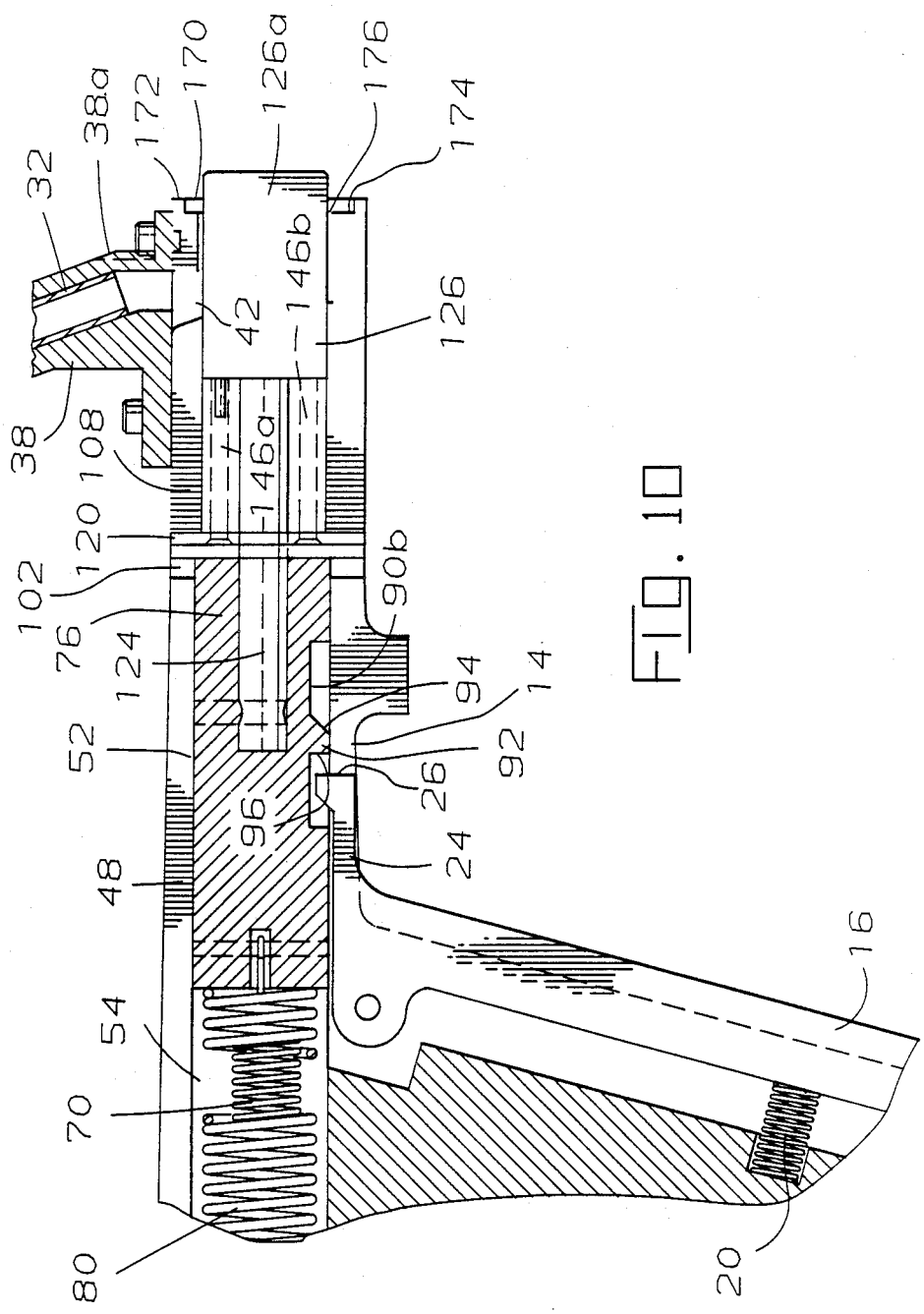
FIG. 10 is a simplified illustration of the forward end of the tool of this invention showing the plunger fully extended out the exit end of the channel.

With plunger 126 to the rear of admitting slot 42, chip carrier 30 now is free to fall from magazine 32 through admitting slot 42 and into the loading channel, as illustrated in FIG. 5. Still keeping the nose of tool 10 in mating contact with the socket as described above, the operator then grasps actuator 84 on the side of the tool and pushes it as far forward as it can go in slot 88. This position, FIG. 10, is farther forward than the cocked position illustrated in FIG. 7. During this movement, a chip carrier is pushed through the loading channel 114 in its predetermined orientation as was previously described in connection with FIGS. 4–6. When carrier 30 reaches the exit end of the channel it enters the void space 252 between the contacts 208 of the socket 200, as illustrated in FIG. 11. Because the nose to tool 10 has been previously accurately aligned relative to this void space, as described above, and because carrier 30 has been carried through channel in its predetermined orientation, carrier 30 enters the void space in its predetermined orientation and its terminals 34 are in position to make good physical and electrical contact with terminals 208 of the socket.

Because outer spring 80 is between the advancing coupler block 62 and plunger slide 76, plunger 126 will apply substantially the same force to each carrier that is loaded into a socket. The spring constant of spring 80 may be selected to provide substantially any force desired.

When actuator 84 is as far forward as it can go in slot 88, plunger slide 76 and slide bars 52, 54 all extend beyond the end of horizontal body portion 14, as illustrated in FIG. 10. Those members push against the back surface of striker plate 120 and push it hard against the back ends of load blocks 106, 108. This causes the forward ends of pins 140 the pass beyond the front face 174 at the exit end of bores 146a-d and to contact the top surfaces of metal frame 230 of the socket, FIG. 11. Pins 140 extend far enough beyond front face 174 to push metal frame 230 past the top edges of the plastic side walls 202, 204 of the frame and to its locking position illustrated in FIG. 11. As frame 230 is pushed downwardly, camming surfaces 244 on the top inner edges of the frame force plastic walls 202, 204 inwardly so that contacts 208 of the socket firmly engage terminals 34 of the chip carrier and hold the carrier firmly in the socket.

Due to the combined operations of keeping a carrier precisely oriented in a desired position as it moves through the load channel, and by precisely positioning the nose of the tool peripherally about the frame and on the top of the socket prior to and during loading, carriers are loaded into the sockets with great accuracy and speed, thereby avoiding the frustration and loss of time that was common in the past when loading the carriers into sockets by hand. Further, due to outer spring 80 acting to push plunger slide 76 forward, a carrier is loaded into a socket with a predetermined force.

Semiconductor conductor chip carriers come in a variety of different sizes and shapes. To accommodate these different carriers, respective different load heads 110 may be provided to load them into sockets in the manner described above. It is a simple and quick operation to replace one load head by a different one. Referring to FIGS. 1–3, screws 100c, 102c, 106c and 108c are removed from coupler plates 100, 102. Similarly, the screw that passes through aperture 134 in plunger slide 76 and into aperture 136 in stem 124 of plunger 126 is removed to disengage plunger 126 from plunger slide 76. A new load head and plunger then are attached as previously described, and the tool 10 is ready to load different carriers into different sized and/or shaped sockets. The carriers may have contacts extending from more than two opposite sides, and the contacts may be the so-called surface mounted contacts.

In its broader aspects, this invention is not limited to the specific embodiment illustrated and described. Various changes and modifications may be made without departing from the inventive principles herein disclosed.

We claim:

1. An apparatus for loading electrical connectors into sockets, a load head comprising,
    an enclosed channel having an exit end,
    an entrance slot for admitting connectors having a predetermined orientation into the interior of said channel,
    a plunger within said channel adapted to translate forwardly and backwardly therein,
    said plunger being constructed and arranged to have its forward end closely behind a connector entering said channel from the entrance slot when the plunger is in an unactuated position and the dimensions of the channel being proportioned so that its walls are closely adjacent the connector as the connector enters the channel, whereby the connector is restrained from tipping backwardly or sideways by the front end of the plunger and by the walls of the channel, and
    means at the exit end of the channel for engaging said connector and guiding it through the exit end of the channel with said predetermined orientation as a forward moving plunger pushes the connector through the exit end of the channel and discharges the connector from said load head in response to forward motion of said slide means in the housing.

2. The apparatus claimed in claim 1 wherein said connector includes terminals extending outwardly from opposite sides thereof, and wherein the terminals of a connector are adjacent opposite walls of the channel when a connector is admitted thereto with said predetermined orientation, and wherein, means at the exit end of the channel slidingly engages at least some of said terminals on the connector for maintaining the connector in said predetermined orientation as the connector is pushed through the channel by said plunger.

3. The apparatus claimed in claim 2 wherein said connector includes terminals extending outwardly from opposite lateral sides thereof, and wherein the terminals of a connector are adjacent opposite side walls of the channel when a connector is admitted thereto with said predetermined orientation, and wherein said exit end of the channel further includes means for engaging said connector and guiding it through the exit end of the channel, said last named means comprising,

- a plurality of spaced parallel ridges protruding inwardly from opposite walls of said channel,
- said ridges extending in the direction of forward motion of said plunger from said resilient restraining means substantially to the exit end of the channel, thereby providing a plurality of spaced parallel void spaces therebetween,
- the void spaces between said inwardly protruding ridges being in registration with the terminals on the sides of a connector when a carrier is in said predetermined orientation in the channel, whereby said protruding ridges serve as guides to slidingly engage said terminals and maintain said connector in its predetermined orientation as the plunger pushes the connector through the channel and out said exit end.

4. The apparatus claimed in claim 1 wherein the load head further includes,
- at least one bore extending through said load head parallel to and in spaced relationship to said channel,
- said bore opening at the forward end of the load head adjacent said exit end of the channel,
- said bore being adapted to receive a push pin that is translatable forwardly and backwardly therein,
- said bore having a length so that a push pin of given length may translate from a first position at which the forward end of the pin is within the load head to a second position at which the forward end of the pin is beyond the front end of the bore.

5. The apparatus claimed in claim 1 wherein the load head further includes,
- at least one bore extending through said load head parallel to and in spaced relationship to said channel,
- said bore opening at the forward end of the load head adjacent said exit end of the channel,
- a push pin in said bore adapted to translate forwardly and backwardly therein,
- actuating means coupled to said plunger for moving the forward end of the plunger from said unactuated position within the channel to an extended position beyond the exit end of the channel,
- said actuating means being coupled to said push pin and adapted to move the forward end of said push pin from a position within said load head to a position beyond the front end of the bore as the plunger moves from its unactuated position to its extended position.

6. The apparatus claimed in claim 5 and including,
resilient means connected between said actuating means and said plunger so that a moving plunger is adapted to exert a force of no more than substantially a given magnitude against an obstructing means irrespective of movement of the actuating means within limits of motion.

7. Apparatus for loading electrical connectors into a socket, comprising,
- an elongated hollow housing,
- slide means within said hollow housing adapted to slide forwardly and backwardly therein,
- actuator means for translating said slide means from a first position adjacent the rear of said housing to a second position adjacent the front of said housing,
- a load head positioned in front of said housing,
- a channel extending through said load head and having an exit end at the front end of the load head,
- an entrance slot in said load head for admitting connectors having a predetermined orientation into the interior of said channel,
- a plunger within the load head adapted to translate forwardly and backwardly within said channel,
- means including a compression spring having one end fixed to said slide means for coupling said plunger to said slide means,
- said compression spring operating to translate motion of said slide means to said plunger, said spring compressing when the resistive force acting against said plunger exceeds a predetermined magnitude, whereby a forward moving slide means continues moving toward the front of said housing after the plunger ceases moving as a result of resistive forces of a predetermined magnitude being applied to the plunger,
- said plunger being constructed and arranged to have its forward end closely adjacent a connector entering said channel from the entrance slot when the plunger is an unactuated position and the width of the channel being proportioned so that its walls are closely adjacent a connector as the connector enters the channel, whereby the connector is restrained from tipping backwardly or sideways by the front end of the plunger and by the walls of the channel,
- means at the exit end of the channel for engaging said connector and guiding it through the exit end of the channel with said predetermined orientation as a forward moving plunger pushes the connector through the exit end of the channel and discharges the connector from said load head in response to forward motion of said slide means in the housing.

8. Apparatus for loading chip carriers as claimed in claim 7 wherein said means at the exit end of the channel includes,
- means on opposite walls of said channel for resiliently engaging said carrier as it is moved toward said exit end by an advancing plunger,
- said plunger engaging the carrier over substantially the entire surface of the carrier that is facing said plunger, whereby the means that resiliently engages the carrier forces the carrier into intimate contact with the plunger thereby to support the carrier as it moves to said exit end.

9. The apparatus claimed in claim 8 wherein said means for resiliently engaging said carrier includes spring means extending inwardly into the channel from opposite walls thereof,
- said spring means being positioned forwardly of said entrance slot where the carriers are admitted to said channel so that the carriers are freely admitted to the channel prior to being engaged by the spring means.

10. The apparatus claimed in claim 9 wherein said carriers include terminals extending outwardly from opposite lateral sides thereof, and wherein the terminals of a carrier are adjacent opposite side walls of the channel when a carrier is admitted thereto with said predetermined orientation.

11. The apparatus claimed in claim 10 wherein said means at the exit end of the channel for engaging said carrier and guiding it through the exit end of the channel includes,
- a plurality of spaced parallel ridges protruding inwardly from opposite walls of said channel forward of said resilient means,
- said ridges extending in the direction of forward motion of said plunger from said resilient means substantially to the exit end of the load head, thereby providing a plurality of spaced parallel void spaces therebetween,
- the void spaces between said inwardly protruding ridges being in registration with the terminals on the sides of a carrier when a carrier is in said predetermined orientation in the channel, whereby said protruding ridges serve as guides to slidingly engage said terminals and maintain said carrier in its predetermined orientation as the plunger bushes the carrier through the channel and out said exit end.

12. Apparatus for loading chip carriers into a socket as claimed in claim 7 and including,
- at least one bore extending through said load head parallel to and in spaced relationship to said channel,
- said bore opening at the front end of the load head,
- a push pin in said bore adapted to translate forwardly and backwardly therein,
- connecting means for connecting said actuator means to said push pin,
- said push pin having a length selected so that the forward end of the pin extends outwardly from the front end of the bore by a predetermined distance when the actuator means is in its second position, but said pin is within the load head when the actuator is in its first position.

13. The apparatus for loading chip carriers into sockets as claimed in claim 12 wherein,
said connecting means that connects the actuator to the push pin includes said slide means in the hollow housing.

14. The apparatus for loading chip carriers into sockets as claimed in claim 13 wherein,
- said load head is connected to said housing by coupler means that maintains a fixed separation between the housing and load head, and wherein,
- said connecting means for connecting the actuator means to the push pin includes a striker plate to which the push pin is connected,
- said striker plate being positioned between the separated housing and load head and being movable therebetween,
- said slide means and striker plate being so constructed and arranged that the slide means contacts the striker plate when the actuator is in its second position and pushes the striker plate against the rear of the load head, whereby the forward end of the push pin is extended from the front end of said bore.

15. The combination claimed in claim 14 wherein,
said push pin is one of a plurality of push pins each of which is translatable in a respective bore that is parallel to and spaced from the channel and the other bores,
all of said push pins being connected to said striker plate and all being substantially the same length.

16. The apparatus for loading chip carriers into sockets as claimed in claim 14 wherein the means that included a compression spring for coupling said plunger to said slide means includes,
- a plunger slide within said hollow housing positioned forwardly of said compression spring and transversely adjacent at least part of said slide means,
- a stem fixedly connecting said plunger to said plunger slide,
- said striker plate having an aperture therein for freely receiving said stem, whereby the striker plate is free to move between said housing and said load head.

17. The apparatus for loading chip carriers into sockets as claimed in claim 16 wherein,
- said compression spring has one end fixed relative to said slide means and the opposite end is free to contact said plunger slide when the slide means is at a given position within said housing, further movement of said slide means forward of said given position causing said plunger slide to move forwardly,
- said slide means and said plunger slide being constructed and arranged so that they both contact said striker plate and push the striker plate against the load head when said actuator is in its second position.

18. The apparatus for loading chip carriers into sockets as claimed in claim 17 and including,
- spring means attached to said plunger slide for urging said plunger slide toward the rear of said housing, and
- stop means for stopping the rearward movement of said plunger slide so that the plunger that is connected thereto is in an unactuated position with its front end closely adjacent said entrance slot on the load head.

19. The apparatus for loading chip carriers into sockets as claimed in claim 18 and further including,
- movable cam means on said housing and cooperating cam means on said plunger slide for releasably holding said plunger slide and plunger in predetermined forward positions against the tension of said spring means, said predetermined forward positions being selected so that the front end of the plunger extends out the front end of said channel,
- the length of the push pin being selected so that it does not extend out the front end of the bore when the plunger is in its predetermined forward position.

20. The apparatus for loading chip carriers into sockets as claimed in claim 19 wherein said housing includes,
- a handle engagable by an operator,
- trigger means on said handle for moving said movable cam means relative to the cam means on the plunger slide to release the plunger slide and permit the spring means to pull the plunger to its unactuated position in the load head.

21. Apparatus claimed in claim 11 and including,
- at least one bore extending through said load head parallel to and in spaced relationship to said channel, said bore opening at the front end of the load head, a push pin in said bore adapted to translate forwardly and backwardly therein, connecting means for connecting said autuator means to said push pin, said push pin having a length selected so that the forward end of the pin extends outwardly from the front end of the bore by a predetermined distance when the actuator means is in its second position, but said pin is within the load head when the actuator is in its first position.

22. A method of loading a semiconductor chip carrier into a socket, wherein said carrier has a body and electrical terminals extending from the body, and wherein said socket has an open side in the central region thereof adapted to receive said carrier body, and wherein said socket includes electrical terminals positioned to make physical and electrical contact with terminals of a carrier that is loaded into the socket with a predetermined orientation, said method comprising the steps providing a loading tool that has a translatable plunger in a load channel that has an exit end, translating the plunger in the channel to cause the plunger to extend beyond the exit end of the channel by a predetermined distance, advancing the tool toward said socket to insert the extended plunger into the open side of the socket and to align the channel with the open side of the socket, retracing said plunger from the open side of the socket and into the channel while maintaining the load channel in registration with the open side of the socket, introducing into said channel between the exit end thereof and the end of said retracted plunger a chip carrier having a predetermined orientation, and advancing the forward end of the plunger toward the socket to load the carrier having the predetermined orientation into the open end of the socket.

23. The method of loading a socket claimed in claim 22 wherein said tool includes a front face at the exit end of the channel and a frame-like extension on said front face spaced about the exit end of the channel, and wherein the extension is proportioned to receive and register with the periphery of the socket, said method including the step placing the frame-like extension about and in registration with the periphery of the socket when the extended plunger is inserted into the open side of the socket prior to introducing a carrier into the channel, and maintaining the frame-like extension in registration with the periphery of the socket while the plunger is retracted, while the carrier is introduced into the channel, and while the plunger loads the carrier into the socket.

24. The method of loading a socket claimed in claim 22 wherein said tool includes a front face at the exit end of the channel and a frame-like extension on said front face spaced about the exit end of the channel, and wherein the extension is proportioned to receive and register with the periphery of the socket, said method including the step withdrawing said tool and plunger from contact with said loaded socket.

* * * * *